United States Patent
Leischner et al.

(10) Patent No.: US 9,026,889 B2
(45) Date of Patent: *May 5, 2015

(54) SYSTEMATIC MITIGATION OF MEMORY ERRORS

(71) Applicant: Microsoft Corporation, Redmond, WA (US)

(72) Inventors: Garrett Leischner, Seattle, WA (US); Andrew J. Lagattuta, Redmond, WA (US); Matthew Jeremiah Eason, Sammamish, WA (US); Landy Wang, Honolulu, HI (US); John R. Douceur, Bellevue, WA (US); Baskar Sridharan, Sammamish, WA (US); Edmund B. Nightingale, Redmond, WA (US)

(73) Assignee: Microsoft Technologoy Licensing, LLC, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/148,741

(22) Filed: Jan. 7, 2014

(65) Prior Publication Data

US 2014/0181577 A1 Jun. 26, 2014

Related U.S. Application Data

(63) Continuation of application No. 12/956,342, filed on Nov. 30, 2010, now Pat. No. 8,627,176.

(51) Int. Cl.
*H03M 13/00* (2006.01)
*G06F 11/07* (2006.01)
(Continued)

(52) U.S. Cl.
CPC .......... *G06F 11/073* (2013.01); *G06F 11/0793* (2013.01); *G11C 29/04* (2013.01); *G11C 29/76* (2013.01); *G11C 2029/0409* (2013.01)

(58) Field of Classification Search
CPC ... G06F 11/073; G06F 11/0793; G11C 29/76; G11C 2029/0409
USPC ............. 714/6.13, 25, 30, 726, 736, 763, 746
See application file for complete search history.

(56) References Cited

U.S. PATENT DOCUMENTS 5,457,696 A 10/1995 Mori
6,353,910 B1 3/2002 Carnevale et al.
(Continued)

OTHER PUBLICATIONS

Final Office Action from U.S. Appl. No. 12/940,780, mailed Mar. 31, 2014, 21 pages.
(Continued)

*Primary Examiner* — Shelly A Chase
(74) *Attorney, Agent, or Firm* — John Jardine; Raghu Chinagudabha; Micky Minhas

(57) ABSTRACT

A system and method for mitigating memory errors in a computer system. Faulty memory is identified and tested by a memory manager of an operating system. The memory manager may perform diagnostic tests while the operating system is executing on the computer system. Regions of memory that are being used by software components of the computer system may also be tested. The memory manager maintains a stored information about faulty memory regions. Regions are added to the stored information when they are determined to be faulty by a diagnostic test tool. Memory regions are allocated to software components by the memory manager after checking the stored information about faulty memory regions. This ensures a faulty memory region is never allocated to a software component of the computer system.

20 Claims, 5 Drawing Sheets

(51) Int. Cl.
*G11C 29/04* (2006.01)
*G11C 29/00* (2006.01)

(56) References Cited

U.S. PATENT DOCUMENTS

| | | | |
|---|---|---|---|
| 7,346,755 | B2 | 3/2008 | Pomaranski et al. |
| 7,478,271 | B2* | 1/2009 | Ho ............................ 714/6.13 |
| 7,478,289 | B1* | 1/2009 | Tamasi et al. ................. 714/718 |
| 7,523,274 | B2 | 4/2009 | Ryu et al. |
| 7,559,000 | B2 | 7/2009 | Sato |
| 7,571,295 | B2 | 8/2009 | Sakarda et al. |
| 7,581,078 | B2 | 8/2009 | Ware |
| 7,685,376 | B2 | 3/2010 | Zimmer et al. |
| 7,770,079 | B2 | 8/2010 | Radke et al. |
| 8,412,885 | B2 | 4/2013 | Cheng et al. |
| 2002/0133742 | A1 | 9/2002 | Hsu et al. |
| 2003/0188180 | A1 | 10/2003 | Overney |
| 2004/0117688 | A1 | 6/2004 | Vainsencher et al. |
| 2004/0250036 | A1 | 12/2004 | Willman et al. |
| 2005/0273605 | A1 | 12/2005 | Saha et al. |
| 2009/0144624 | A1 | 6/2009 | Barnes, Jr. |
| 2009/0164742 | A1 | 6/2009 | Wach et al. |
| 2009/0259806 | A1 | 10/2009 | Kilzer et al. |
| 2010/0031345 | A1 | 2/2010 | Sinclair |
| 2010/0070686 | A1 | 3/2010 | Mergler et al. |
| 2011/0173443 | A1 | 7/2011 | Osterwalder et al. |
| 2012/0117304 | A1 | 5/2012 | Worthington et al. |
| 2012/0137167 | A1 | 5/2012 | Leischner et al. |

OTHER PUBLICATIONS

Non-Final Office Action from U.S. Appl. No. 12/940,780, mailed Jul. 15, 2014, 23 pages.
"Check for RAM Error or Defect in Windows 7 and Vista with Windows Memory Diagnostic," http://www.mydigitallife.info/2009/10/01/check-for-ram-error-or-defect-in-windows-7-and-vista-with-windows-memory-diagnostic/, published Oct. 1, 2009.
"How to Scan Windows 7 for Memory Errors," http://www.webtlk.com/2009/12/07/how-to-scan-windows-7-for-memory-error, Dec. 7, 2009.
"Windows Hardware Error Architecture Predictive Failure Analysis," Microsoft Corp., May 5, 2010.
"Windows Memory Diagnostic," http://oca.microsoft.com/en/windiag.asp, published 2008, downloaded Sep. 9, 2010.
Abts et al., "Architectural Support for Mitigating DRAM Soft Errors in Large-Scale Supercomputers," University of Minnesota Institute of Technology, Dept. Elec. & Computer Eng., Colloquium Mar. 8, 2007.
Avissar, O. et al., "Heterogeneous Memory Management for Embedded Systems," CASES '01, Atlanta, GA, Nov. 16-17, 2001, 10 pages.
Bivens, A. et al., "Architectural Design for Next Generation Heterogeneous Memory Systems," IEEE, downloaded Aug. 10, 2010, 4 pages.
Calin et al., "Upset-Tolerant CMOS SRAM Using Current Monitoring: Prototype and Test Experiments," Proceedings International Test Conference, Oct. 21-25, 1995, Washington, D.C., USA, Paper 2.4, pp. 45-53.
Dhiman, G., et al., "PDRAM: A Hybrid PRAM and DRAM Main Memory System," DAC '09, San Franciso, CA, Jul. 26-31, 2009, 6 pages.
Final Office Action from U.S. Appl. No. 12/940,780, mailed Jun. 20, 2013, 19 pages.
Marsden, A., Memtest86.com—Memory Diagnostic, last updated 01103/2009, http://www.memtest86.com, downloaded Nov. 12, 2010, 19 pages.
Non-Final Office Action from U.S. Appl. No. 12/940,780, mailed Dec. 20, 2012, 16 pages.
Non-Final Office Action from U.S. Appl. No. 12/940,780, mailed Sep. 4, 2013, 20 pages.
Qureshi, M.K. et al., "Enhancing Lifetime and Security ofPCM-Based Main Memory with Start-Gap Wear Leveling," MICRO '09, New York, NY, Dec. 12-16, 2009, 10 pages.
Saha, Goutam Kumar, "A Low-Cost Testing for Transient Faults," Ubiquity 7(2), Jan. 17-23, 2006.
Notice of Allowance from U.S. Appl. No. 12/940,780, mailed Nov. 12, 2014, 5 pages.

* cited by examiner

SYSTEMATIC MITIGATION OF MEMORY ERRORS

CROSS-REFERENCE TO RELATED APPLICATION(S)

This application is a continuation of U.S. patent application Ser. No. 12/956,342, filed Nov. 30, 2010, now U.S. Pat. No. 8,627,176, issued Jan. 7, 2014, entitled "SYSTEMATIC MITIGATION OF MEMORY ERRORS". The entirety of this afore-mentioned application is incorporated herein by reference.

BACKGROUND

The reliability of a computer system is only as good as the underlying hardware of the system. Faults in the Random Access Memory (RAM) of a computer system, whether the faults are permanent or transient, often manifest themselves in the form of software instability and crashes. When applications or the Operating System (OS) of the computer system crash, the user may assume the cause is software related and therefore blame the software developer for the instability of their computer system. This not only hurts the reputation of the software developer in the marketplace, but it also requires the company to provide customer service to help users resolve problems that arise from RAM failures.

Aside from the harm to the software developer caused by faults in RAM, there is the possibility that a fault could result in corruption of the user's data or other undesired and unforeseen consequences.

To reduce memory errors, it is known to perform diagnostic tests on RAM at start-up. These tests are performed before the operating system is executing because they alter the contents of the memory, which would interfere with an executing operating system or other software components. For this purpose, some memory chips include circuitry to perform built-in self test (BIST) and can provide information identifying faulty pages in the memory to a memory manager in the operating system. Alternatively, some operating systems have incorporated memory tests such that the operating system itself can identify faulty pages in memory. The memory manager can then maintain stored information about faulty pages in the memory. When an application requests that memory to be allocated to it, pages that have been identified as faulty are not allocated.

It is also possible for memory tests to be implemented as application programs. These implementations generally don't have as much access to the memory and system resources as memory tests that are integrated into the OS—especially the kernel of the OS.

Some computer systems use memory that can correct errors through the use of error correcting coding (ECC). Each ECC has a strength that indicates a number of bit errors in a unit of data read from memory that can be corrected by the code. When more errors than can be corrected occur in a unit of memory, then the errors cannot be corrected. Though, the ECC may nonetheless reveal that an error occurred, such that additional faulty pages may be identified as the operating system is running

SUMMARY

Described herein are techniques for mitigating apparent software errors caused by faulty RAM in a computer system. Errors may be detected through a scan of regions of the memory or may be detected in response to a condition encountered by a software component executing on the computing system. In this way, memory errors may be detected while the OS is executing, without the use of memory equipped with ECC.

The OS may identify and test a region of RAM. If a region identified for testing has been allocated, the OS may move data out of that region such that the region may be subjected to a scan test. If the test determines that the region of RAM is faulty, then it may be added to stored information about faulty regions, which is maintained by the memory manager of the OS. When allocating memory regions to software components, the memory manager may exclude regions of memory that are indicated as faulty according to the stored information.

Dynamic identification of faulty RAM regions, in some embodiments, may be triggered by an event received from a software component, such as an exception or other indicator of an error. The trigger may indicate a specific region of RAM as potentially faulty or it may simply indicate that an error occurred generally. In response to an error of a type likely associated with a memory fault, the operating system may add an identified region to the stored information about faulty regions that are not allocated. If no specific RAM region is indicated by the trigger event, then the operating system may initiate testing of portions of RAM to dynamically identify faulty regions and add them to the stored information.

The foregoing is a non-limiting summary of the invention, which is defined by the attached claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
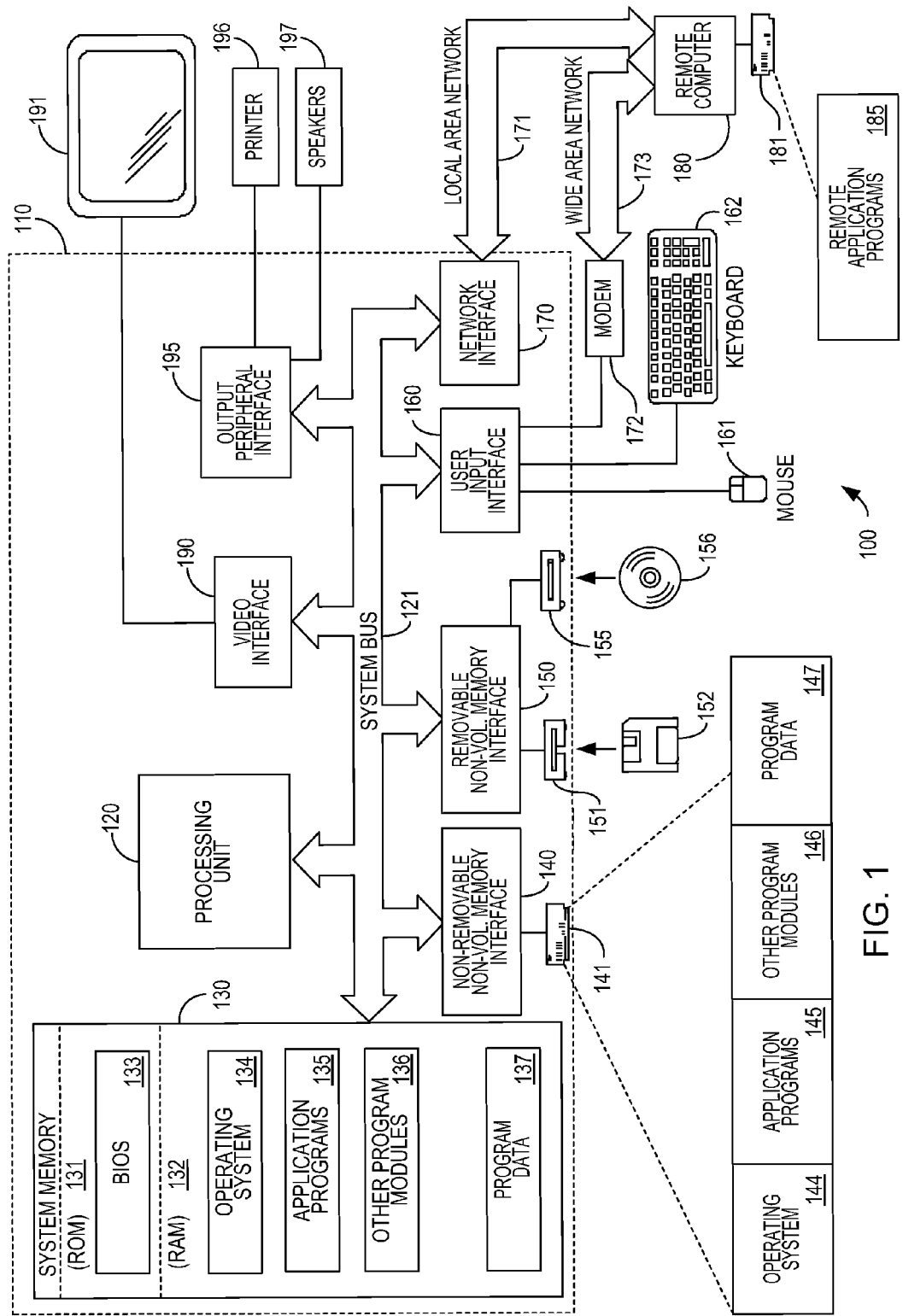
FIG. 1 is a block diagram of an exemplary environment in which embodiments of the invention may operate.

The inventors have recognized and appreciated that mitigating memory errors in a computer system may increase reliability and stability. The system and method presented herein can mitigate these errors while the operating system (OS) is currently being executed by a processor of the computer system.

The technique also does not require special hardware, such as error-correcting code (ECC) memory. Embodiments of the invention may be implemented in software operating on general purpose hardware. For example, techniques as described herein may be implemented by modifying a portion of the operating system that is sometimes called a memory manager.

In some embodiments, the memory manager interfaces with the RAM of a computer system. The memory manager allocates RAM to software components that request memory resources. To ensure that a software component does not allocate RAM that is faulty, the OS may maintain stored information about RAM regions that have previously been found to cause errors.

In some embodiments, the stored information about faulty RAM regions is created by the memory manager of the OS. Multiple sources of information may be used to create the stored information. One source of information may be from testing. The memory manager may perform a diagnostic test of RAM regions to determine which regions are faulty. Once a region is found to be faulty, it may be added to the stored information about faulty RAM regions that is maintained by the memory manager.

In some embodiments, the memory manager can identify the RAM regions on which to run the diagnostic test. It may identify a particular RAM region to scan, a collection of RAM regions or the entirety of available RAM regions. Regions to test may be identified in any suitable way. In some embodiments, regions may be randomly selected for testing or may be scheduled in accordance with a predetermined pattern.

In some embodiments, the memory manager may receive a trigger event in response to which it performs the diagnostic test. The trigger event may be a user of the computer system manually initiating a scan. Alternatively, the trigger event could be from a software component that encountered an error.

Regardless of the source of the trigger, the memory manager may initiate a memory test to identify or confirm a faulty region. Though, in some scenarios, a software component indicating an error may be able to determine which RAM region caused the error. If so, then the this information may be included in the trigger event sent to the memory manager. The memory manager may selectively run the diagnostic test on the identified RAM region. Though, embodiments are possible in which a region is indicated as faulty, based on such an indication of an error, without any further testing.

Any suitable mechanism may be deployed as the diagnostic test. In some embodiments the diagnostic test comprises scanning the RAM regions to be tested and determining whether the regions are faulty. The scan may comprise writing a pattern of bits to the region being tested and, after the bits have been written, reading the pattern that is stored in the RAM region. The written pattern and the read pattern are then compared. If the pattern has changed, this indicates that there is an error being within the RAM.

The pattern of bits used to scan the RAM region may be any combination of bits, including patterns as are known in the art. For example, it could be all ones or all zeros. Alternatively, the pattern may alternate between one and zero. Also, a random pattern of zeros and ones may be used to scan the RAM region or a pattern in which a single bit of each word is set to a one, and the bit that is set to a one may change in each of multiple successive write cycles.

In some embodiments, the regions that are identified to be tested may be currently allocated to a software component. It is possible for the memory manager to scan this RAM region. The memory manager can swap the contents of the RAM region that needs to be tested with an available region of RAM. This may be accomplished by allocating a free RAM region to the software component, transferring the contents of the RAM region that needs to be tested to the newly allocated RAM region and releasing the region to be tested such that it is no longer allocated to the software component.

Techniques as are known in the art may be used for making this swap. For example, a memory manager may assign virtual addresses for use by software components. The memory manager, or other components of the computer system, may apply a mapping to translate these virtual addresses into physical addresses for RAM chips. To free a first region of physical memory for testing, the memory manager may copy the data from the first region to a second region of physical memory. The memory manager may then alter the mapping so that the virtual addresses used by a component point to the second region of physical memory.

The stored information about faulty RAM regions may be stored in several different ways. In one embodiment, the permanent information about faulty RAM regions may be stored somewhere accessible by the boot manager. When the computer boots, the stored information can be used by the boot manager while initializing the OS such that the faulty RAM indicated as faulty is never made available to the OS, making it appear to the OS that the faulty RAM regions do not even exist.

A different embodiment may store information about faulty RAM in volatile memory, such as the RAM itself. In this embodiment, the stored information will be deleted and reset every time the computer system powers off. Resetting the stored information may be advantageous for storing an identification of RAM regions in a system that may be subject to transient faults. If the memory manager cannot determine whether the RAM region is permanently faulty or cannot determine with a sufficiently high confidence that a RAM region is faulty at all, it may quarantine that RAM region by including that region among the stored information about faulty regions until a reboot occurs and resets the stored information.

Alternatively or additionally, the information about faulty RAM may be stored in a persistent memory structure such that the stored information is persistently maintained through a computer system reboot. This type of faulty RAM region information is useful for recording regions of RAM that have been determined by the memory manager to be permanently faulty and not worth using in the future.

Though, it should be appreciated that other techniques may be used to address the possibility of transient faults and indications of faulty regions with a low confidence that the RAM regions have faults. For example, the stored information about faulty regions may be retained in persistent storage, but may incorporate information indicating a frequency of a fault occurring in a particular region or a confidence level associated with a determination that a region is faulty.

As a specific example, if a software error occurs of the type that could be caused by a faulty memory region, that region may be added to stored information with an indication that such a fault was detected once or that such a fault has a low confidence value. Such an indication may not preclude the memory region from being allocated to another software component. However, if that same fault recurs, the confidence level of the fault may be increased, such that the region is not allocated again. Conversely, if the same fault does not recur over some period, the region may be removed from the stored information entirely.

Other techniques may be used in managing the stored information about faulty regions. Even regions indicated as permanently faulty may be retested periodically and possibly removed from the stored information if they retest without error or retest a sufficient number of times without error. As another example, if changes in a hardware configuration of a computer system are detected, such as may indicate a replacement of the memory chips, the stored information may be reset, regions associated with replaced RAM chips may be removed from the stored information or regions may be retested.

Any embodiment of stored information about faulty RAM may be edited by a user of the computer system. This will allow the user to manually add or remove RAM regions from the stored information. This can be important if the user changes or adds new hardware components to the computer system. For example, if the user removes an old RAM chip and installs a new one, the user should reset the stored information about faulty RAM regions, otherwise the computer system may unintentionally prevent non-faulty RAM regions of the new RAM chip from being allocated to software components.

FIG. 1 illustrates an example of a suitable computing system environment 100 on which the invention may be implemented. The computing system environment 100 is only one example of a suitable computing environment and is not intended to suggest any limitation as to the scope of use or functionality of the invention. Neither should the computing environment 100 be interpreted as having any dependency or requirement relating to any one or combination of components illustrated in the exemplary operating environment 100.

The invention is operational with numerous other general purpose or special purpose computing system environments or configurations. Examples of well known computing systems, environments, and/or configurations that may be suitable for use with the invention include, but are not limited to, personal computers, server computers, hand-held or laptop devices, multiprocessor systems, microprocessor-based systems, set top boxes, programmable consumer electronics, network PCs, minicomputers, mainframe computers, distributed computing environments that include any of the above systems or devices, and the like.

The computing environment may execute computer-executable instructions, such as program modules. Generally, program modules include routines, programs, objects, components, data structures, etc. that perform particular tasks or implement particular abstract data types. The invention may also be practiced in distributed computing environments where tasks are performed by remote processing devices that are linked through a communications network. In a distributed computing environment, program modules may be located in both local and remote computer storage media including memory storage devices.

With reference to FIG. 1, an exemplary system for implementing the invention includes a general purpose computing device in the form of a computer 110. Computer 110 is an example of a computer device that may systematically mitigate memory errors. Components of computer 110 may include, but are not limited to, a processing unit 120, a system memory 130, and a system bus 121 that couples various system components including the system memory to the processing unit 120. The system bus 121 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

Computer 110 typically includes a variety of computer readable media. Computer readable media can be any available media that can be accessed by computer 110 and includes both volatile and nonvolatile media, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can accessed by computer 110. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer readable media.

The system memory 130 includes computer storage media in the form of volatile and/or nonvolatile memory such as read only memory (ROM) 131 and random access memory (RAM) 132. A basic input/output system 133 (BIOS), containing the basic routines that help to transfer information between elements within computer 110, such as during start-up, is typically stored in ROM 131. RAM 132 typically contains data and/or program modules that are immediately accessible to and/or presently being operated on by processing unit 120. By way of example, and not limitation, FIG. 1 illustrates operating system 134, application programs 135, other program modules 136, and program data 137.

The computer 110 may also include other removable/non-removable, volatile/nonvolatile computer storage media. By way of example only, FIG. 1 illustrates a hard disk drive 140 that reads from or writes to non-removable, nonvolatile magnetic media, a magnetic disk drive 151 that reads from or writes to a removable, nonvolatile magnetic disk 152, and an optical disk drive 155 that reads from or writes to a removable, nonvolatile optical disk 156 such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 141 is typically connected to the system bus 121 through an non-removable memory interface such as interface 140, and magnetic disk drive 151 and optical disk drive 155 are typically connected to the system bus 121 by a removable memory interface, such as interface 150.

The drives and their associated computer storage media discussed above and illustrated in FIG. 1, provide storage of computer readable instructions, data structures, program modules and other data for the computer 110. In FIG. 1, for example, hard disk drive 141 is illustrated as storing operating system 144, application programs 145, other program modules 146, and program data 147. Note that these components can either be the same as or different from operating system 134, application programs 135, other program modules 136, and program data 137. Operating system 144, application programs 145, other program modules 146, and program data 147 are given different numbers here to illustrate that, at a minimum, they are different copies. A user may enter commands and information into the computer 110 through input devices such as a keyboard 162 and pointing device 161, commonly referred to as a mouse, trackball or touch pad. Other input devices (not shown) may include a microphone, joystick, game pad, satellite dish, scanner, or the like. These and other input devices are often connected to the processing unit 120 through a user input interface 160 that is coupled to the system bus, but may be connected by other interface and bus structures, such as a parallel port, game port or a universal serial bus (USB). A monitor 191 or other type of display device is also connected to the system bus 121 via an interface, such as a video interface 190. In addition to the monitor, computers may also include other peripheral output devices such as speakers 197 and printer 196, which may be connected through a output peripheral interface 195.

The computer 110 may operate in a networked environment using logical connections to one or more remote computers, such as a remote computer 180. The remote computer 180 may be a personal computer, a server, a router, a network PC, a peer device or other common network node, and typically includes many or all of the elements described above relative to the computer 110, although only a memory storage device 181 has been illustrated in FIG. 1. The logical connections depicted in FIG. 1 include a local area network (LAN) 171 and a wide area network (WAN) 173, but may also include other networks. Such networking environments are commonplace in offices, enterprise-wide computer networks, intranets and the Internet.

When used in a LAN networking environment, the computer 110 is connected to the LAN 171 through a network interface or adapter 170. When used in a WAN networking environment, the computer 110 typically includes a modem 172 or other means for establishing communications over the WAN 173, such as the Internet. The modem 172, which may be internal or external, may be connected to the system bus 121 via the user input interface 160, or other appropriate mechanism. In a networked environment, program modules depicted relative to the computer 110, or portions thereof, may be stored in the remote memory storage device. By way of example, and not limitation, FIG. 1 illustrates remote application programs 185 as residing on memory device 181. It will be appreciated that the network connections shown are exemplary and other means of establishing a communications link between the computers may be used.

Figure 2:
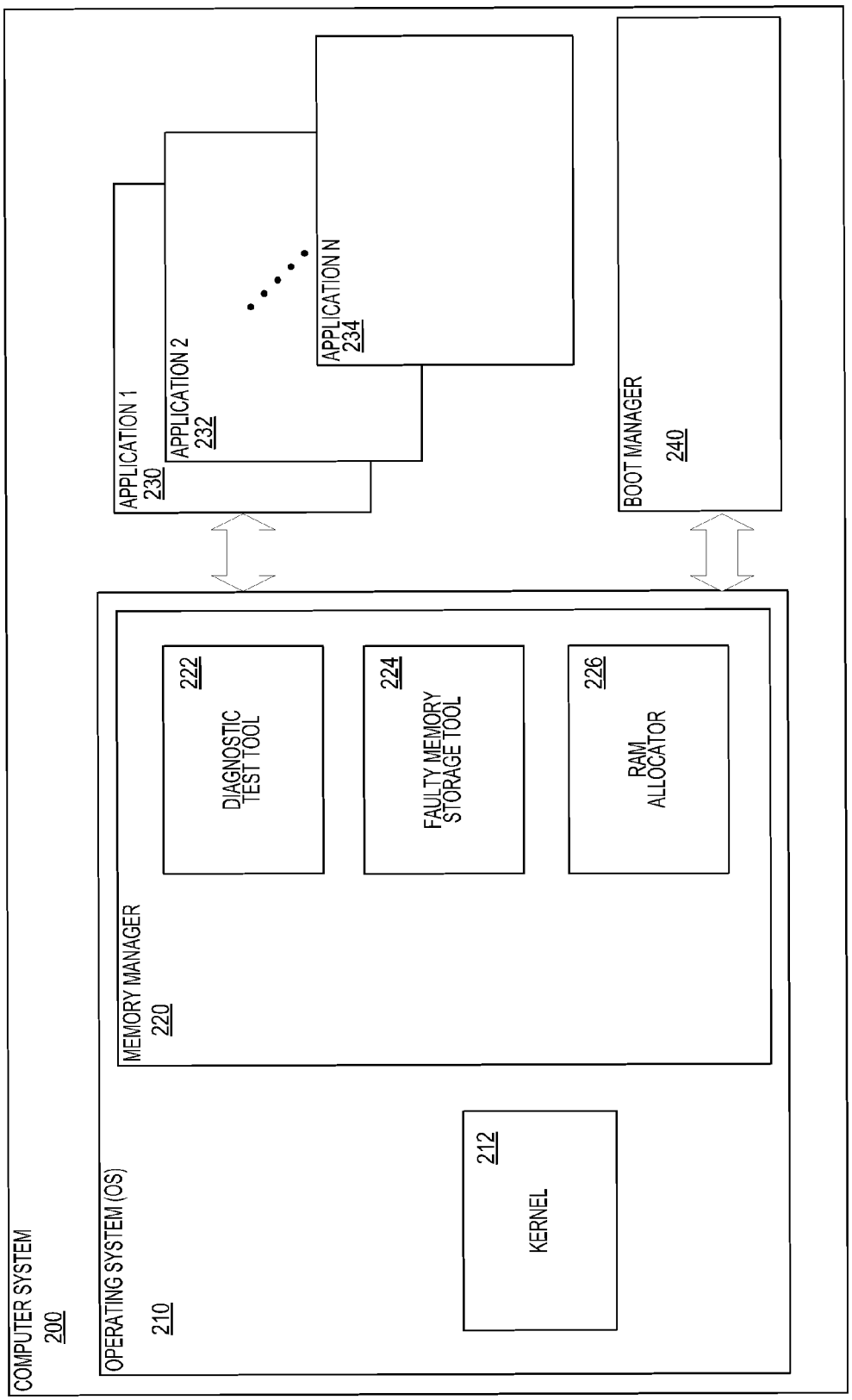
FIG. 2 is a block diagram showing several software components of a computing system of some embodiments of the present invention.

FIG. 2 illustrates some of the software components that are used in embodiments of the present invention. These software components of computer system 200 are generally stored in RAM 132, non-removable non-volatile memory 141, or a combination thereof.

The Operating System (OS) 210 is software that is generally used to control the hardware of the computer system 200. The OS ensures that all the pieces of the computer system work together in a coherent manner. The component of the OS that handles core functionalities of the hardware is referred to as the kernel 212. The OS 210 may be implemented using techniques as are known in the art.

The computer system 200 executes application programs 230, 232 and 234. Application programs interface with the hardware of the computer system 200 through the OS 210. Requests from application programs 230 to utilize hardware, such as RAM 132 or the processing unit 120, are all handled by the OS 210.

The boot manager 240 is another component of computer system 200. When the computer system is initially turned on, there is no OS in RAM 132 for the processing unit 120 to execute. The stored OS 144 must be loaded from non-volatile memory 141 to RAM 132 where the OS 134 can be executed by processing unit 120. This is the job of boot manager 240, which is preferably stored in ROM 131. The boot manager 240 may comprise BIOS 133. The boot manager 240 may be implemented using techniques as are known in the art.

OS 210 includes a memory manager 220, which may be part of the kernel 212, but is shown separately in example computer system 200 of FIG. 2. The memory manager 220 provides all software components on the computer system 200 access to the RAM 132, whether the software components belong to the OS 210 or an application program 230. The memory manager 220 uses RAM allocator 226 to allocate memory to software components and mediates requests from multiple components that simultaneously request RAM. RAM allocator 226 may be implemented using techniques as are known in the art, except that RAM allocator 226 does not allocate memory regions indicated as faulty.

The memory manager 220 generally breaks the RAM 132 into multiple regions, which are allocated to applications. The specific meaning of a region may depend on the implementation of an operating system and possibly the underlying RAM hardware. Examples of regions are pages, segments or blocks. RAM is not allocated to applications 230 in single bit units. Rather, it is allocated in regions—meaning the smallest unit of memory that may be allocated by the memory manager 220 to an application 230 is a single region. The size of RAM regions varies depending on the specifics of the computer system 200, but an example size of a RAM region may be 4096 bytes.

Example computer system 200 shows the diagnostic test tool 222 and the faulty memory storage tool 224 as part of memory manager 220. It should be understood that the invention is not limited to this particular embodiment. The diagnostic test tool 222 and/or the faulty memory storage tool 224 may be included in some other part of the OS 210. Further, they may not be part of the OS at all, but rather an application program such as application 232, that is installed and executed on computer system 200 independent from the OS 210.

There are several advantages to embodiments where the memory manager 220 is part of the kernel 212, For example, the memory manager 220 may have access to more memory regions, such as regions in use by the kernel itself, allowing for a more comprehensive system. Also, by including the memory manager 220 in the kernel 212 the diagnostic test tool can be run transparently and noninvasively such that a user of the computer system 200 is unaware that a diagnostic test is being performed. Though this embodiment has advantages, the present invention is not limited to this particular embodiment.

Figure 3:
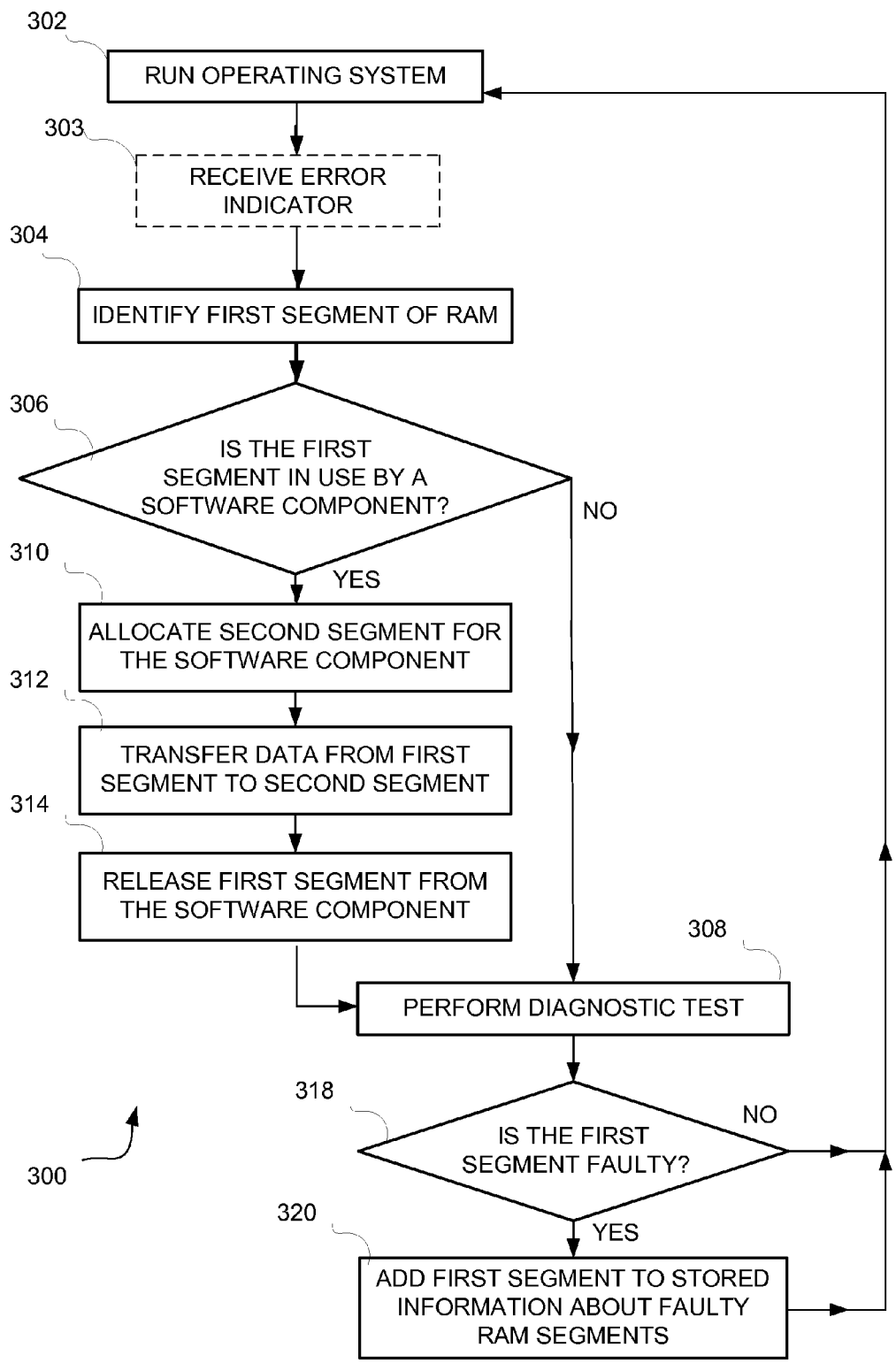
FIG. 3 is a flow chart of an exemplary process of mitigating memory errors.

As stated in the above, RAM 132 may become faulty. The computer system 200 would be more stable and reliable if faulty regions of RAM 132 were never allocated to software components. Embodiments of the present invention mitigate RAM errors using method 300 detailed in FIG. 3 that avoids allocation of faulty regions.

The technique begins at act 302 by running the OS 210 on processing unit 120. The OS is initiated using the boot manager 240. Running the OS 210 means that the memory manager 220 will also be running and managing the RAM 132.

In some embodiments, the memory manager 220 may receive an indicator of an error from a software component at act 303. The software component may be application program 234 or a component of the OS 210. The error indicator is optional and is not a limitation of all embodiments of the present invention.

The error indicator is received by the memory manager 220 when an error has occurred in the software component. In some embodiments the error indicator is only sent when the error is related to memory failure. If the software component that encountered an error is able to ascertain the RAM region that caused the error then that information may be included in the error indicator sent to the memory manager 220.

At act 304, the memory manager 220 identifies a region of RAM to test. This identification of a RAM region may be triggered in many different ways. In one embodiment, a user of computer system 200 may manually initiate a scan of all RAM regions to test the RAM for faults. Alternatively or additionally, the memory manager 220 receives a trigger event from a software component. Trigger events from software components indicate that an error occurred in the software program while executing. Certain errors are indicative of a memory failure and it is possible, in some instances, for the OS 210 to identify the particular RAM region that caused the error. If the RAM region is identifiable, then the identity of the failed RAM region may be passed to the memory manager 220. At this point the memory manager can choose to test only the failed RAM region, a selected group of RAM regions or all RAM regions.

In a further embodiment, a trigger event may be received based on a set schedule. For example, the OS may arrange for full memory scans at scheduled intervals. Scans may also be scheduled at times when the computer system 200 is not actively being used.

Once at least one RAM region has been identified for testing, the memory manager 220 checks whether the RAM region is currently in use by a software component at act 306. If the RAM is free, then the memory manager 220 will proceed to perform a diagnostic test on the RAM region at act 308. If the RAM region is currently in use, then the memory manager will perform a series of actions (310, 312 and 314) to free the RAM region so that it may be tested. The details of these acts are described in detail below.

At step 308, the diagnostic test tool 222 performs the actual diagnostic test on the identified RAM region. The diagnostic test determines whether the RAM region is faulty. If it is not faulty, then decision block 318 returns to running the OS at act 302. If the RAM region is determined to be faulty, then the decision block 318 continues to act 320 where the faulty RAM region is added to the stored information about faulty RAM regions that is maintained by memory manager 220. The information about faulty RAM regions may be stored in faulty memory storage tool 224. This stored information may be represented in various forms. In one embodiment, this information may be structured as a list of faulty RAM regions. As another example, this information may be represented by using a flag associated with each RAM region, wherein a particular value of the flag indicates that the RAM region is faulty. Many techniques are known in the art for associating descriptive information with objects, and any of these techniques can be readily employed by the faulty memory storage tool 224.

Once act 320 is complete and future memory errors have thus been mitigated, the computer system 200 returns to running the OS at act 302. At this point the entire process may be repeated the next time the memory manager 220 identifies a region of RAM to be tested.

The above discussion described a sequence of events that may occur when it is determined at decision block 306 that the region of RAM to be tested was not in use by a software component. If it is determined that the region of RAM is in use by a software component at decision block 306, then the method continues to act 310. At act 310, RAM allocator 226 allocates a free region of RAM to the software component that is using the RAM region to be tested. The data that is stored in the RAM region to be tested is then transferred to the new free region of RAM at act 312. Once the data transfer is complete, the memory manager 220 releases the RAM region to be tested at act 314. Here, "release" may mean that the data stored in the RAM is no longer used by the software component. It may also mean that the region is no longer allocated to the software component that was previously using it.

Once the RAM region to be tested is no longer in use by any software component of the computer system 200, it continues to act 308. At this point, the method continues in the same manner as described above in the instance that the RAM region was not in use by a software component.

Figure 4:
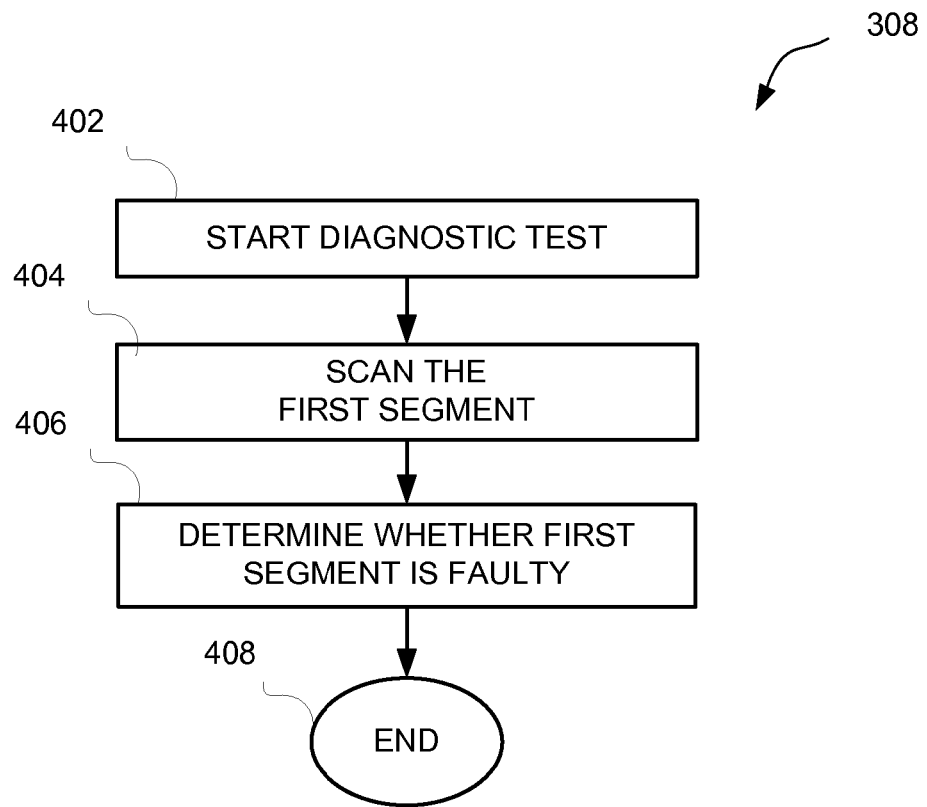
FIG. 4 is a flow chart of an exemplary process of performing a diagnostic test.

Any suitable mechanism may be used to perform the diagnostic test at act 308 of method 300. FIG. 4 describes one particular embodiment of the diagnostic test. The test begins at act 402. The diagnostic test tool 222 is initiated by the memory manager 220 after the RAM region to be tested has been identified and it is not being used by any software component of the computer system 200. At act 404, the diagnostic test tool 224 performs a scan of the region being tested. After the scan, act 406 determines whether the RAM region is faulty based on the results of the scan. The diagnostic test ends at act 408 and method 300 will continue to decision block 318.

Figure 5:
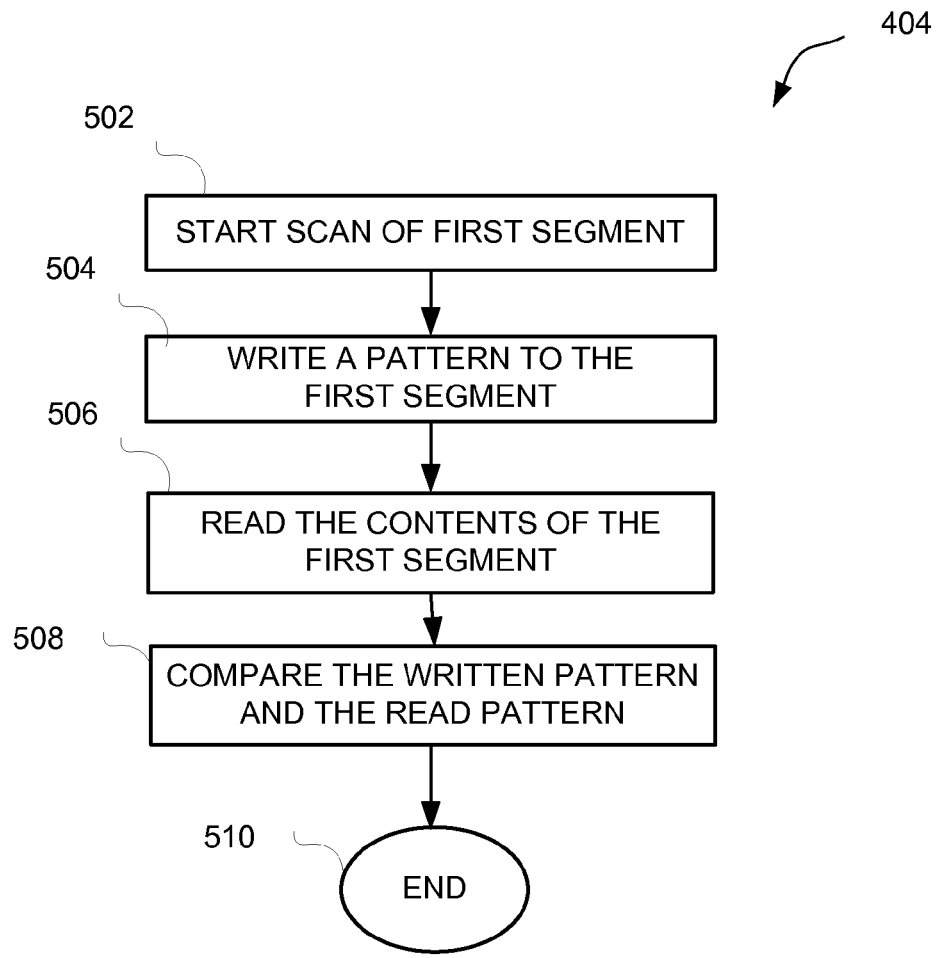
FIG. 5 is a flow chart of an exemplary process of scanning a memory region.

The scan that is performed by the diagnostic test tool 222 at step 404 of the diagnostic test 308 may be performed in any number of ways that will suitably test the RAM regions for faults. An example embodiment of this scan 404 is shown in FIG. 5. The scan of the RAM region is started in act 502 after the diagnostic test tool 222 begins the diagnostic scan. At act 504, the diagnostic test tool 222 writes at least one pattern of ones and zeros to the region of RAM being tested. The pattern can be anything: all zeros, all ones, alternating ones/zeros, a random pattern or some other pattern. Once the pattern has been written to the RAM region in act 504, the diagnostic test tool 222 reads the same RAM region at act 506. The written pattern and the read pattern are compared at step 508. If the patterns differ, it may be concluded that some portion of the RAM region caused the error and is potentially faulty. The act of scanning 404 terminates at act 510 and the diagnostic test of act 308 continues to act 406.

Having thus described several aspects of at least one embodiment of this invention, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, the invention may be embodied as a computer readable medium (or multiple computer readable media) (e.g., a computer memory, one or more floppy discs, compact discs (CD), optical discs, digital video disks (DVD), magnetic tapes, flash memories, circuit configurations in Field Programmable Gate Arrays or other semiconductor devices, or other non-transitory, tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above. As used herein, the term "non-transitory computer-readable storage medium" encompasses only a computer-readable medium that can be considered to be a manufacture (i.e., article of manufacture) or a machine.

The terms "program" or "software" are used herein in a generic sense to refer to any type of computer code or set of computer-executable instructions that can be employed to program a computer or other processor to implement various aspects of the present invention as discussed above. Additionally, it should be appreciated that according to one aspect of this embodiment, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that conveys relationship between the fields. However, any suitable mechanism may be used to establish a relationship between information in fields of a data structure, including through the use of pointers, tags or other mechanisms that establish relationship between data elements.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A computing device for managing memory, the computing device comprising:
    a system memory; and
    a processor, wherein the system memory and the processor respectively store and execute at least a portion of an Operating System (OS) for the computing device, wherein the OS allocates regions of the system memory for use by the OS and by one or more applications, and wherein the OS including a memory manager that performs operations comprising:
        while the OS is executing, encountering an error condition associated with execution of a software component, the error condition indicative of a likely failure within a first memory region of the system memory;
        the memory manager receiving an indication of the error condition associated with execution of the software component;
        in response to the received indication of the error condition, detecting a failure within the first memory region;
        adding an indication that the first region has been determined to be faulty to a stored list of faulty memory regions; and
        using the stored list of faulty memory regions to allocate at least a second memory region of the system memory for use by one or more software components, wherein the second memory region is not indicated as faulty according to the stored list of faulty memory regions.

2. The computing device of claim 1, wherein the stored list of faulty memory regions is deleted as part of a reboot of the computing device.

3. The computing device of claim 1, wherein the stored list of faulty memory regions is stored such that the list does not change when the OS shuts down.

4. The computing device of claim 1, wherein detecting the failure within the first memory region comprises:
    testing at least the first memory region, the testing comprising:
        writing a first pattern to the first memory region;
        reading a second pattern from the first memory region; and
        determining that the first pattern is different from the second pattern; and
    determining that the first memory region is faulty in response to determining that the first pattern is different from the second pattern.

5. The computing device of claim 4, wherein testing at least the first memory region comprises testing only the first memory region.

6. The computing device of claim 4, wherein the operations further comprise:
    determining that the first region is currently storing data for a first software component;
    allocating a third memory region of the system memory;
    copying the data stored in the first memory region to the third memory region; and
    freeing the first memory region.

7. A computing device for managing memory, the computing device comprising:
    a memory; and
    a processor, wherein the memory and the processor respectively store and execute instructions that:
        run an Operating System (OS) using at least a portion of the memory;
        identify at least a first region of the memory to be tested;
        perform a diagnostic test of at least the first region, wherein the diagnostic test comprises:
            a scan of at least the first region; and
            a determination that the first region is faulty;
        maintain stored information about faulty memory regions;
        in response to a determination that the first region is faulty, add an indication that the first region is faulty to the stored information about faulty memory regions; and
        allocate one or more regions of the memory to one or more software components running on the computing device, the allocation comprising checking the stored information about faulty memory regions and excluding memory regions indicated as faulty according to the stored information.

8. The computing device of claim 7, wherein the identification of at least the first region of the memory to be tested comprises:
    receiving a trigger event from a first software component, the trigger event indicating that a fault occurred in the first region of the memory.

9. The computing device of claim 8, wherein the first software component is an application program or is a component of the OS.

10. The computing device of claim 7, wherein:
    the first region of the memory stores data for a first software component of the one or more software components running on the computing device,
    the instructions also:
        allocate a second region of the memory for use by the first software component;
        transfer the data stored in the first region of the memory to the second region of the memory; and
        release the first region of the memory from the first software component.

11. The computing device of claim 7, wherein the instructions also:
    reset the stored information about faulty regions as part of a reboot of the computing device.

12. The computing device of claim 7, wherein the stored information about faulty regions is maintained through a reboot of the computing device.

13. The computing device of claim 7, wherein:
    the scan of at least the first region comprises:
        a write of a first pattern to the first region of the memory;
        a read of a second pattern from the first region of the memory; and
        a comparison of the first and second patterns; and
    wherein
    the determination that the first region is faulty is based on the first pattern being different from the second pattern.

14. At least one computer-readable storage memory having computer-executable instructions stored therein, that when executed by a processor of a computer system, perform operations comprising:
    running an Operating System (OS), wherein the OS uses at least a portion of the memory;
    identifying at least a first region, of a plurality of regions of the memory, to be tested;
    performing a diagnostic test of at least the first region, wherein the diagnostic test comprises:
        scanning at least the first region; and
        determining that the first region is faulty;
    maintaining stored information about faulty memory regions;
    in response to determining that the first region is faulty, adding an indication that the first region is faulty to the stored information about faulty memory regions; and
    allocating one or more regions of the memory to one or more software components running on the computer system, the allocating comprising checking the stored information about faulty memory regions and allocating the one or more regions of the memory from memory regions that are not indicated as faulty according to the stored information.

15. The at least one computer-readable storage memory of claim 14, wherein identifying at least the first region of the memory to be tested comprises:
    receiving a trigger event from a first software component, the trigger event indicating that a fault occurred in the first region of the memory.

16. The at least one computer-readable storage memory of claim 15, wherein the first software component is the OS.

17. The at least one computer-readable storage memory of claim 14, wherein:
    the first region of the memory stores data for a first software component of the one or more software components running on the computer system;
    the operations further comprise:
        allocating a second region of the memory for use by the first software component;

transferring the data stored in the first region of the memory to the second region of the memory; and releasing the first region of the memory from the first software component.

18. The at least one computer-readable storage memory of claim 14, wherein the operations further comprise:

resetting the stored information about faulty regions as part of a reboot of the computer system.

19. The at least one computer-readable storage memory of claim 14, wherein the operations further comprise:

maintaining the stored information about faulty regions through a reboot of the computer system.

20. The at least one computer-readable storage memory of claim 14, wherein:

scanning at least the first region comprises:

writing a first pattern to the first region of the memory;

reading a second pattern from the first region of the memory; and comparing the first and second patterns; and wherein the determination that the first region is faulty is based on the first pattern being different from the second pattern.

\* \* \* \* \*